(12) United States Patent
Dakhil

(10) Patent No.: US 9,350,290 B2
(45) Date of Patent: May 24, 2016

(54) SOLAR WATER-COLLECTING, AIR-CONDITIONING, LIGHT-TRANSMITTING AND POWER GENERATING HOUSE

(71) Applicant: Farouk Dakhil, Rome (IT)

(72) Inventor: Farouk Dakhil, Rome (IT)

( * ) Notice: Subject to any disclaimer, the term of this patent is extended or adjusted under 35 U.S.C. 154(b) by 240 days.

(21) Appl. No.: 14/168,578

(22) Filed: Jan. 30, 2014

(65) Prior Publication Data

US 2015/0214408 A1 Jul. 30, 2015

(51) Int. Cl.
| | |
|---|---|
| H01L 31/042 | (2014.01) |
| H02S 40/44 | (2014.01) |
| F24J 2/34 | (2006.01) |
| F24J 2/38 | (2014.01) |
| H01L 31/052 | (2014.01) |
| F03G 6/00 | (2006.01) |
| F24J 2/04 | (2006.01) |
| F24J 2/08 | (2006.01) |
| F24J 2/16 | (2006.01) |
| F24J 2/10 | (2006.01) |

(52) U.S. Cl.
CPC . *H02S 40/44* (2014.12); *F03G 6/00* (2013.01); *F24J 2/045* (2013.01); *F24J 2/08* (2013.01); *F24J 2/34* (2013.01); *F24J 2/345* (2013.01); *F24J 2/38* (2013.01); *H01L 31/0525* (2013.01); *H02S 20/00* (2013.01); *F24J 2/16* (2013.01); *F24J 2002/1004* (2013.01)

(58) Field of Classification Search
CPC ..... H01L 31/0525; H02S 40/44; H02S 20/00; F24J 2/38; F24J 2/345
USPC .......................................... 136/246, 248, 244
See application file for complete search history.

(56) References Cited

U.S. PATENT DOCUMENTS

| | | | | |
|---|---|---|---|---|
| 4,002,031 | A * | 1/1977 | Bell | ........................ F03G 6/001 126/698 |
| 2002/0189662 | A1* | 12/2002 | Lomparski | ............ H01L 31/052 136/246 |
| 2010/0000596 | A1* | 1/2010 | Mackler | ................ G09F 11/025 136/246 |

* cited by examiner

*Primary Examiner* — Allison Bourke
(74) *Attorney, Agent, or Firm* — Maier & Maier, PLLC

(57) ABSTRACT

A system for collecting solar energy and fresh water may be disclosed. The system may include one or more assemblies of collector modules, each of which module may contain a photovoltaic cell and a thermal fluid. The thermal fluid may be used to heat a building and/or produce electricity. The assembly may further be coupled to a collection shaft which may collect water and/or disseminate light through a building. Various configurations of single modules, single assemblies, or multiple large-scale assemblies are also possible. If integrated with a house, the system may reduce the net energy consumption of the household.

16 Claims, 18 Drawing Sheets

29

29a

29b

29c

US 9,350,290 B2

SOLAR WATER-COLLECTING, AIR-CONDITIONING, LIGHT-TRANSMITTING AND POWER GENERATING HOUSE

BACKGROUND

The world's population has already exceeded seven billion people and it continues to grow exponentially higher. By the year 2050 we may reach 9.5 billion people. The needs for drinking water, nutritious food, and clean energy are more urgent than ever before. While the planet's population is increasing, we also continue the pollution of lands, rivers, and oceans through toxic emissions, mainly by burning fossil fuels to power heavy industry and vehicles. Chemicals are discarded into rivers and oceans from industry and agricultural fertilizers. These are the facts of our daily news and contribute to global warming and climate change.

One problem with current centralized power production facilities is the loss of efficiency and therefore additional resources required to send electricity from the power plant to each of the consuming locations, for example a multitude of households. A similar problem is faced by water utilities; fresh water must be located, treated in a central location, and then pumped to the many locations in which it is to be used.

A solution is needed which can increase self-sufficiency. In particular, the costs of producing energy and clean water heavily tax the environment; there is a need for a low-cost method for meeting those needs on a mass scale.

SUMMARY

According to at least one exemplary embodiment, a system for collecting solar energy and fresh water may be disclosed. The system may include one or more assemblies of collector modules, each of which module may contain a photovoltaic cell and a thermal fluid. The thermal fluid may be used to heat a building and/or produce electricity. The assembly may further be coupled to a collection shaft which may collect water and/or disseminate light through a building. Various configurations of single modules, single assemblies, or multiple large-scale assemblies are also possible. If integrated with a house, the system may reduce the net energy consumption of the household.

BRIEF DESCRIPTION OF THE FIGURES

Advantages of embodiments of the present invention will be apparent from the following detailed description of the exemplary embodiments. The following detailed description should be considered in conjunction with the accompanying figures in which.

Exemplary

Exemplary

Exemplary

Exemplary

Exemplary

Exemplary

Exemplary

Exemplary

Exemplary

Exemplary

Exemplary

Exemplary

Exemplary

Exemplary

Exemplary

Exemplary

Exemplary

Exemplary

DETAILED DESCRIPTION

Aspects of the invention are disclosed in the following description and related drawings directed to specific embodiments of the invention. Alternate embodiments may be devised without departing from the spirit or the scope of the invention. Additionally, well-known elements of exemplary embodiments of the invention will not be described in detail or will be omitted so as not to obscure the relevant details of the invention. Further, to facilitate an understanding of the description discussion of several terms used herein follows.

As used herein, the word "exemplary" means "serving as an example, instance or illustration." The embodiments described herein are not limiting, but rather are exemplary only. It should be understood that the described embodiment are not necessarily to be construed as preferred or advantageous over other embodiments. Moreover, the terms "embodiments of the invention", "embodiments" or "invention" do not require that all embodiments of the invention include the discussed feature, advantage or mode of operation.

According to at least one exemplary embodiment, a system for collecting solar energy and fresh water may be disclosed. The system may include one or more assemblies of collector modules, each of which module may contain a photovoltaic cell and a thermal fluid. The thermal fluid may be used to heat a building and/or produce electricity. The assembly may further be coupled to a collection shaft which may collect water and/or disseminate light through a building. Various configurations of single modules, single assemblies, or multiple large-scale assemblies are also possible. If integrated with a house, the system may reduce the net energy consumption of the household.

Figure 1:
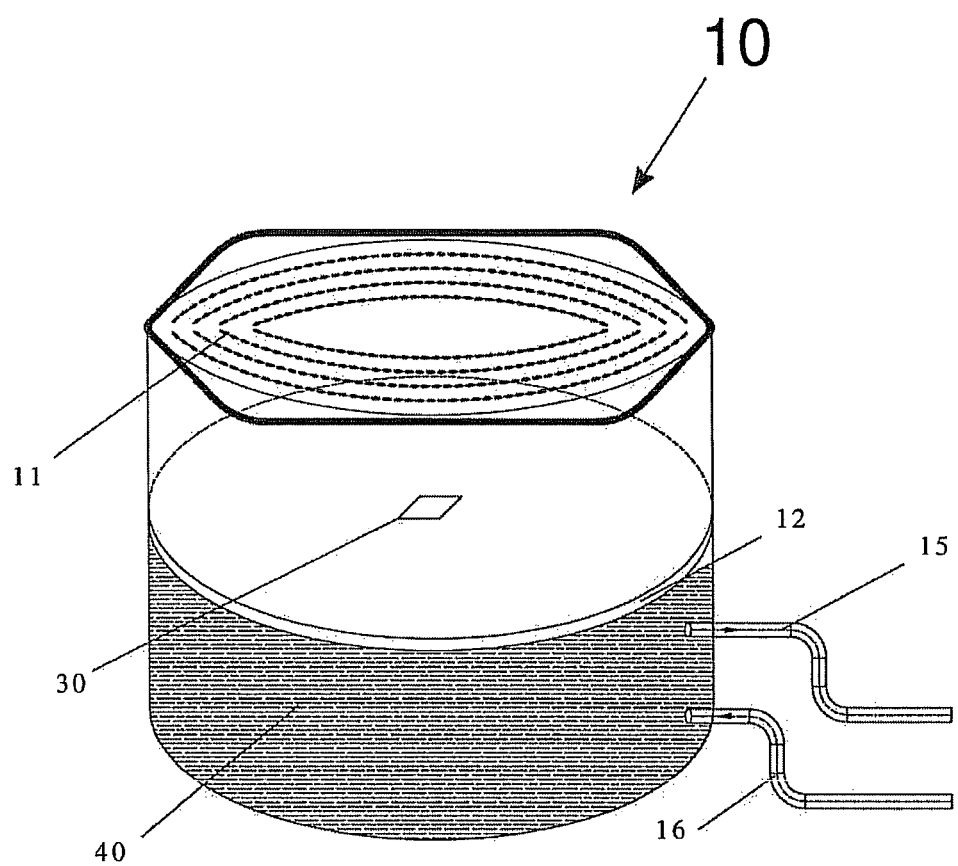
FIG. 1 shows a perspective view of a collector module for solar energy.
Figure 1A:
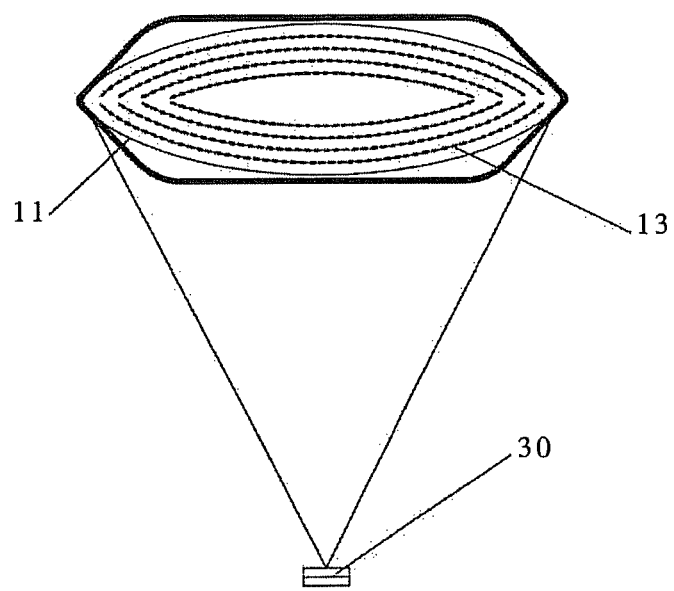
FIG. 1a shows a detailed view of the location of a photovoltaic cell in relation to a concentrating lens of a collector module for solar energy.

Referring to exemplary FIGS. 1 and 1a, a collector module 10 for solar energy may include a concentrating lens 11, a solar photovoltaic (PV) cell 30, and a thermal container 12. Concentrating lens 11 may as thick or as thin as desired for a particular application. Concentrating lens 11 may further be constructed of an acrylic thin-film material, or as desired.

Lens 11 may further be constructed of a multiple-micro-lens material. According to one non-limiting example, lens 11 may be constructed of an acrylic thin-film material with a thickness of approximately 0.3175 cm. Additionally, lens 11 may be colored or colorless, as desired, for example to enhance its aesthetic quality, and/or lens 11 may be in any shape, for example a hexagonal shape. PV cell 30 may be located proximate to the focal point of lens 11. Thermal container 12 may be located below lens 11. For example, PV cell 30 may be located on the top exterior surface of thermal container 12. Thermal container 12 may further be painted black. Lens 11, PV cell 30, and thermal container 12 may be constructed in a 1:1 ratio for every collector module 10, or multiple lenses 11 may be employed for a single thermal container 12, as desired.

According to one non-limiting example, one or more collector modules 10 could be affixed to the roof of a building, for example the roof of a house, to provide solar energy collection for the building. Lens 11 may be coated with a water- and particulate-resistant material to protect the integrity and functionality of collector module 10.

In the use of collector module 10, exemplary temperatures may reach 700-800° Celsius. A thermally-conductive fluid 40 may be used in thermal container 12 to capture and absorb the heat created by concentrating lens 11. Thermally-conductive fluid 40 may be for example molten salt, thermally-conductive oil, or as desired. Fluid 40 may be conducted to and from container 12 through feeder tube 16 and drainage tube 15. Where multiple thermal containers 12 are used in a single application, thermal containers 12 may be connected in parallel or in series through feeder/drainage tubes 16/15, as desired. Feeder tube 16 and drainage tube 15 may allow thermally-conductive fluid 40 to flow in a closed-loop system to transfer the heat energy elsewhere to perform work, for example to heat a building or to heat water to produce steam to drive a turbine-generator for electricity, or as desired.

According to at least one exemplary embodiment, an application of collector module 10 can produce electric energy of at least 0.45 KW/m2 and at an efficiency of at least 90%.

Figure 2:
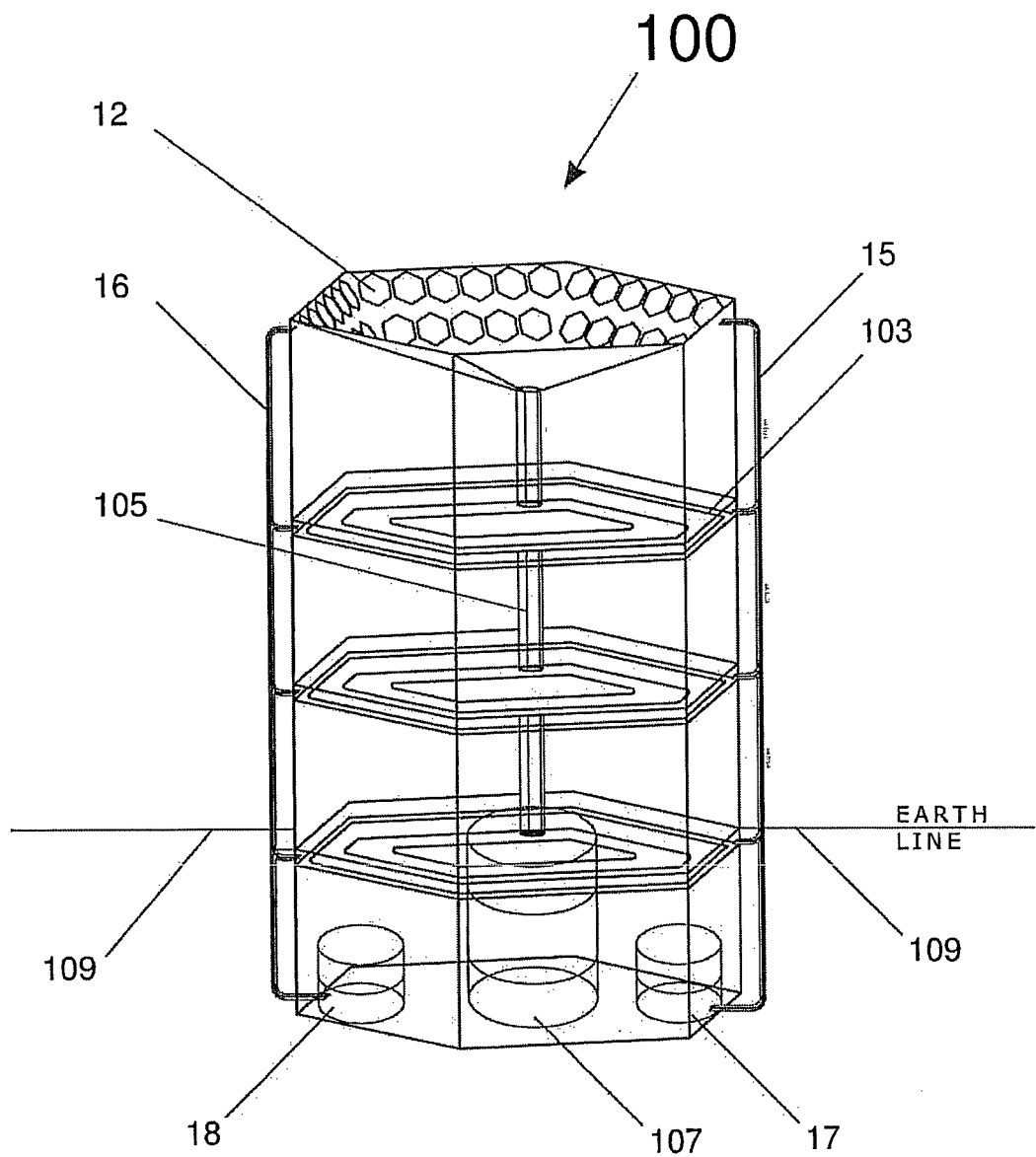
FIG. 2 shows a solar house incorporating a plurality of collector modules.

Referring now to exemplary FIG. 2, a solar house 100 may include a concave roof assembly provided with a plurality of interconnected thermal containers 12 holding a thermally conductive fluid in fluid communication with feeder tube 16 and drainage tube 15. Water- and light-collecting shaft 105 may pass downward through floors 103 of solar house 100 and may terminate below the ground line 109 within a basement. Shaft 105 may cause water to flow through the building into a water-collection container 107.

As solar energy is absorbed by the fluid in thermal containers 12, the fluid may be transferred down by drainage tube 15 to the basement of solar house 100. There may be temperature sensors (not shown) that would, when desired, allow the heated fluid to circulate within the building at each floor 103. When the temperature inside the building is sufficiently high, the heated fluid may flow to a system of storage tanks 17, 18. From storage tanks 17,18 the fluid may be pumped into the floors at night to heat the building, or may be used in a steam-turbine generator (not shown) for electricity generation, or as desired.

Figure 3:
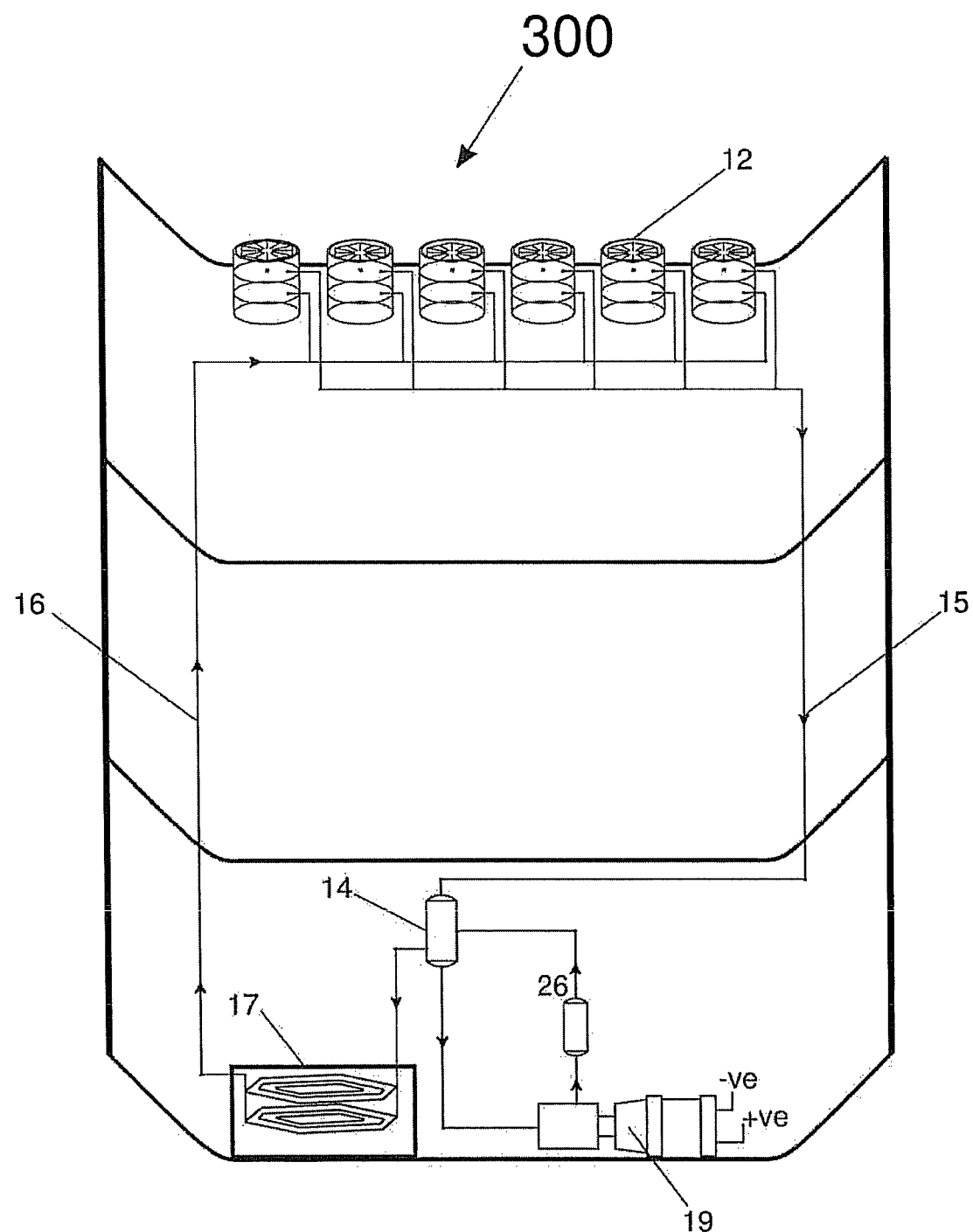
FIG. 3 shows a schematic diagram of a thermal fluid system connected to multiple collector modules.

Exemplary FIG. 3 shows one non-limiting embodiment 300 of a set of six thermal containers 12, each with a concentrating lens, connected in parallel. Each thermal container 12 may contain a thermally-conductive fluid which may further flow through feeder and drainage tubes 16/15, as substantially described above. The fluid may flow to a heat exchanger 14, where it may heat another fluid, for example water/steam, to be used in a steam-turbine generator (STG) 19. Steam condenser 26 may collect outgoing cool air from STG 19 and transfer it back to heat exchanger 14. At night, the thermally-conductive fluid may be transferred to a storage container 17 containing a heat-storage material, for example molten salt. From storage container 17, feeder tube 16 may draw the thermally-conductive fluid back to thermal containers 12 for re-heating.

Figure 4:
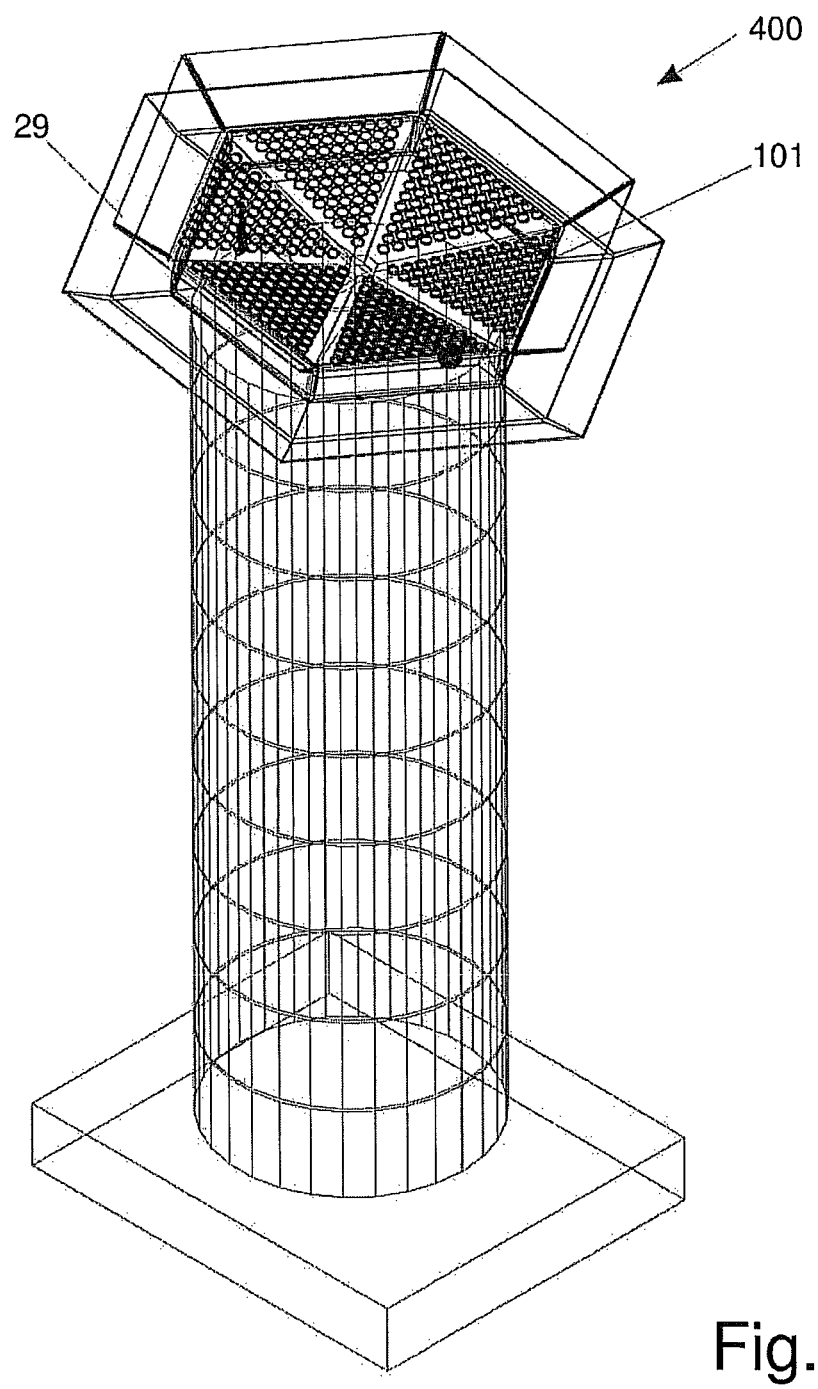
FIG. 4 shows an assembly of collector modules on the roof of a building coupled to a system of reflective mirrors.

Exemplary FIG. 4 illustrates another non-limiting exemplary embodiment 400 wherein a concave assembly 101 holding a plurality of solar energy collecting modules and/or thermal containers, as shown in exemplary FIGS. 1-3 and described above, is further fitted with at least one mirror 29. Mirror 29 may be hinged to concentrate solar energy onto assembly 101, and may be adjusted throughout the day or year to maximize the efficiency of the solar energy collecting modules and/or thermal containers.

Figure 5:
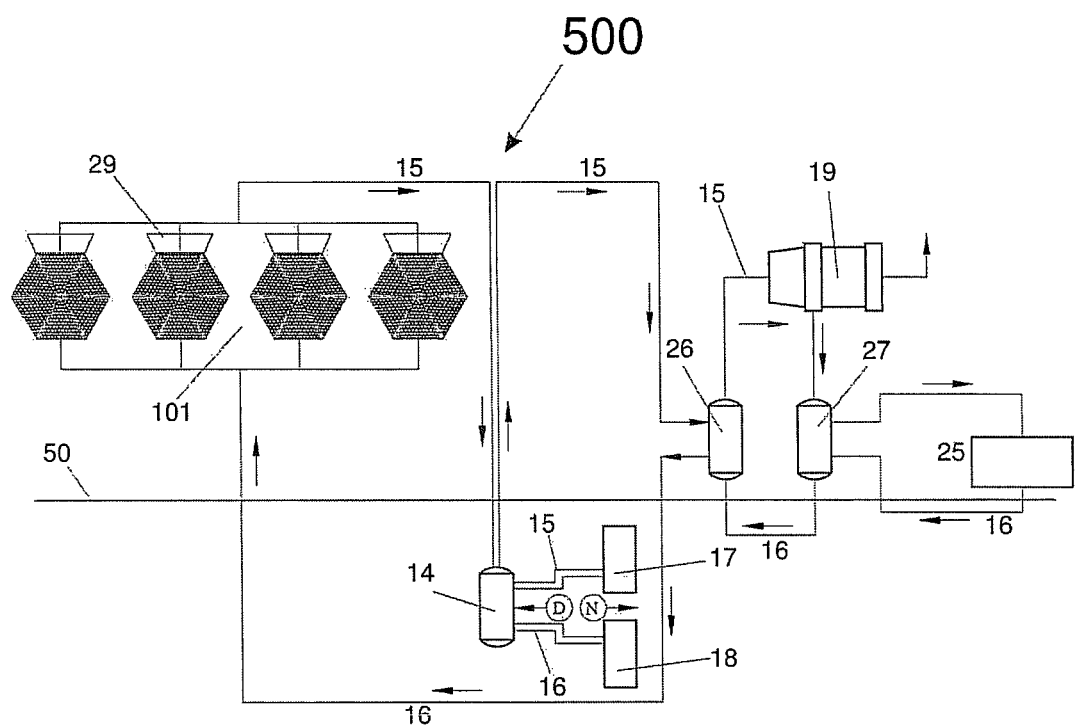
FIG. 5 shows a schematic diagram of a field system incorporating multiple assemblies of collector modules.
Figure 5A:
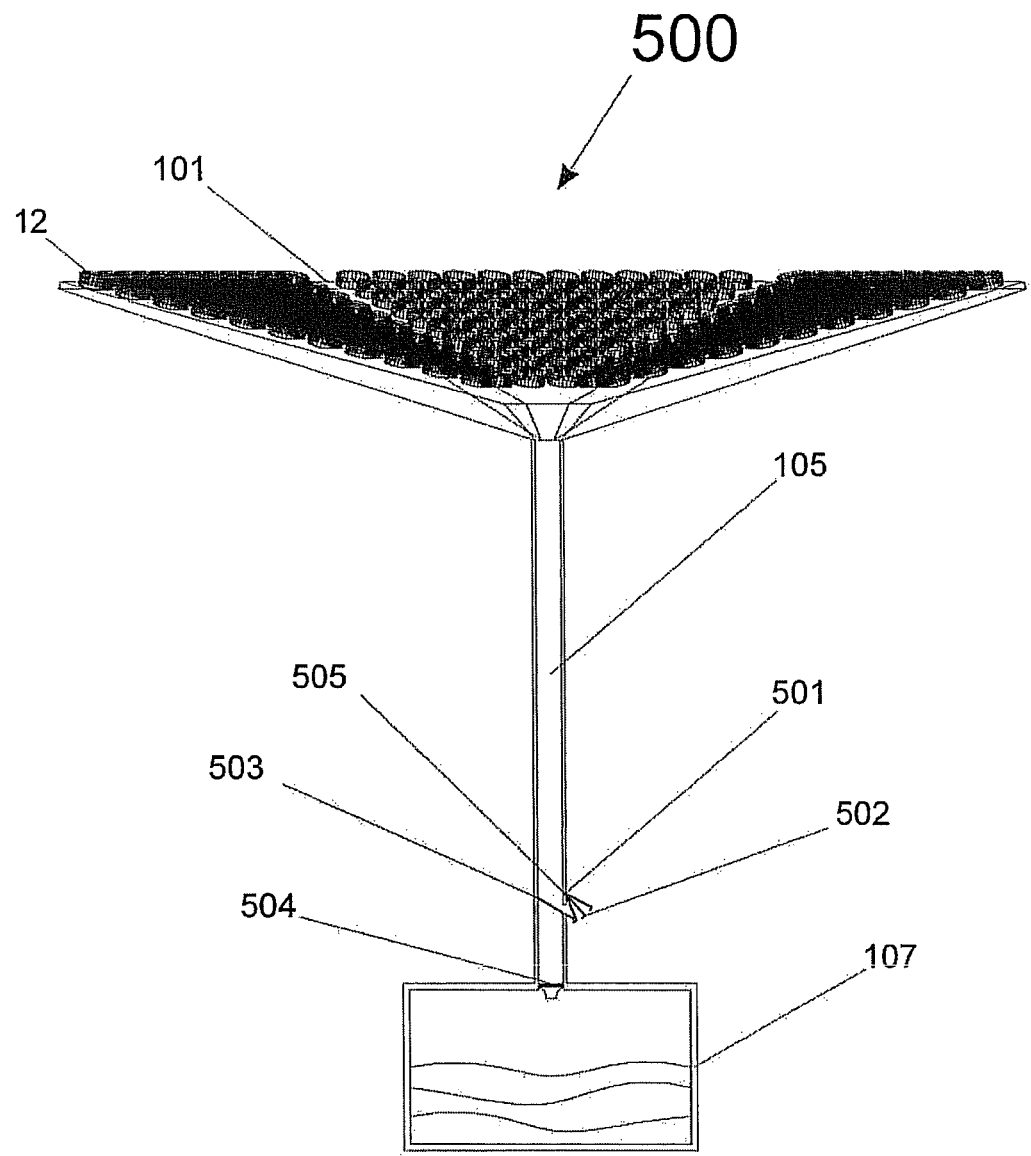
FIG. 5a shows a single assembly of collector modules coupled to a water collection tank.
Figure 5B:
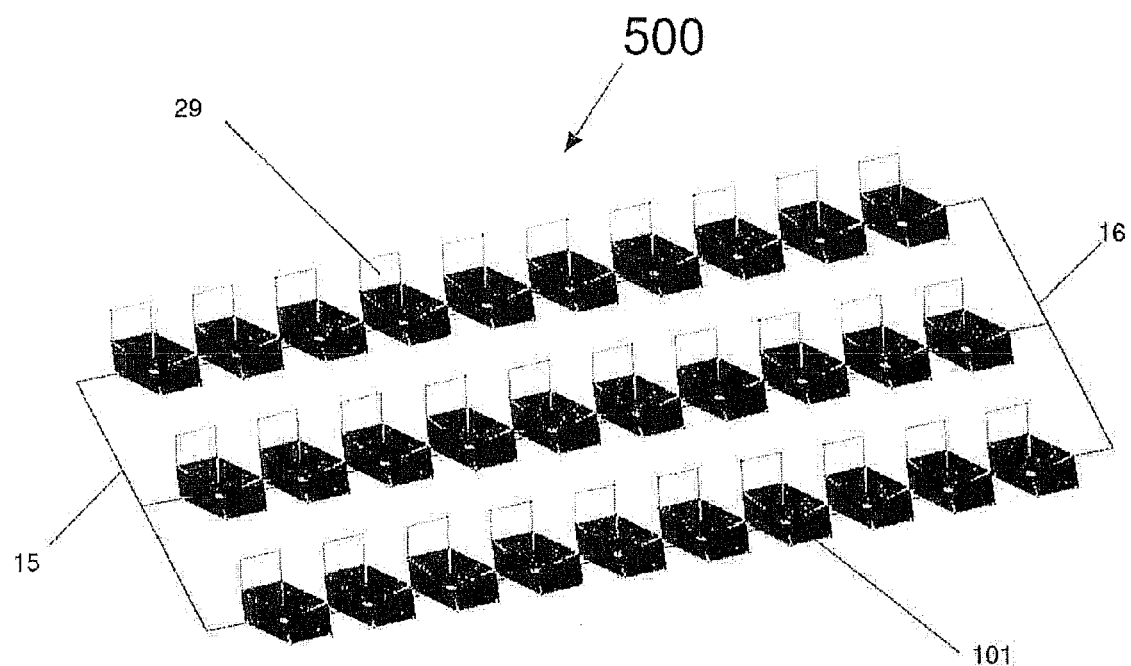
FIG. 5b shows a perspective view of a field system incorporating multiple assemblies of collector modules.

Now referring to exemplary FIGS. 5-5b, a field system 500 utilizing a plurality of solar energy- and/or water-collecting assemblies 101 may be disclosed. Field system 500 may be designed or adapted to work in various environments. For example, in a desert application, a water- and particulate-resistant coating on each lens used together with a concave shape of each assembly 101 may allow water and sand to slide off the lenses. Water can then be filtered and collected separately, such as in container 107. This is an advantage because conventional projects may develop a plaque-like substrate that deposit on the lower part of such conventional parabolic mirrors, and must be cleaned frequently.

Each assembly 101 may be concave and formed in any shape, for example, hexagonal. Each assembly 101 may further be coupled to a mirror 29 which may assist in the efficiency of the collection of solar energy. Each assembly 101 may also be coupled to a collecting shaft 105 for water or any other matter which may fall upon the surface of assembly 101.

A thermally-conductive fluid may travel in a closed-loop system to and from assemblies 101 by way of feeder and drainage tubes 16 and 15, respectively. Heated fluid may be taken from assemblies 101 by way of drainage tube 15 to one or more heat exchangers 14, 26, and/or 27. Heat exchanger 14 may provide access to one or more thermal storage containers 17 and 18. The flow of heat to and from thermal storage containers 17, 18 may be controlled in part based on time of day. For example, heat may be stored in the containers during the day to be used later at night. Additionally, the stored heat may be transferred back into the system at night to maintain a desired viscosity in the fluid, for example when using molten salt. Heat exchanger 26 may be used to heat water or water vapor into steam, which may be used in STG 19 to produce electricity. Spent vapor from STG 19 may then flow to a heat exchange loop including a heat exchanger 27 in fluid communication with an air cooled condenser 25, further cooling and condensing the water, after which it may return to heat exchanger 26.

According to one non-limiting example, field system 500 may be a stand-alone solar power system. Field system 500 may also be integrated with a building or other structure to provide electricity and/or heat to the building or structure.

Additionally, PV cells may be integrated with the thermal containers 12 in a fashion similar to as shown in FIGS. 1 and 1a, and as described above. The PV cells may be connected together and thereby form an additional electricity source for field system 500. A high-temperature resistant PV material may be used, for example, gallium arsenide (GaAs), or as desired.

Each assembly 101 may be coupled to a collection shaft 105 which may further lead to a storage container 107. A filter 503 may be placed proximate to the bottom portion of shaft

105. Filter 503 may be, for example, a semi-permeable membrane through which water may flow but particulate matter may not flow. The water may then fall to a purifying filter 504 before entering container 107. Located proximate to filter 503 may be a door 502 operated by a sensor 501 by way of an opening mechanism 505. Sensor 501 may detect for an accumulation of particulate matter, and when a threshold level has been reached, door 502 may be opened to allow the particulates to drop out. Alternatively, door 502 may remain open at all times, allowing particulates to continuously drop out of shaft 105.

Figure 6:
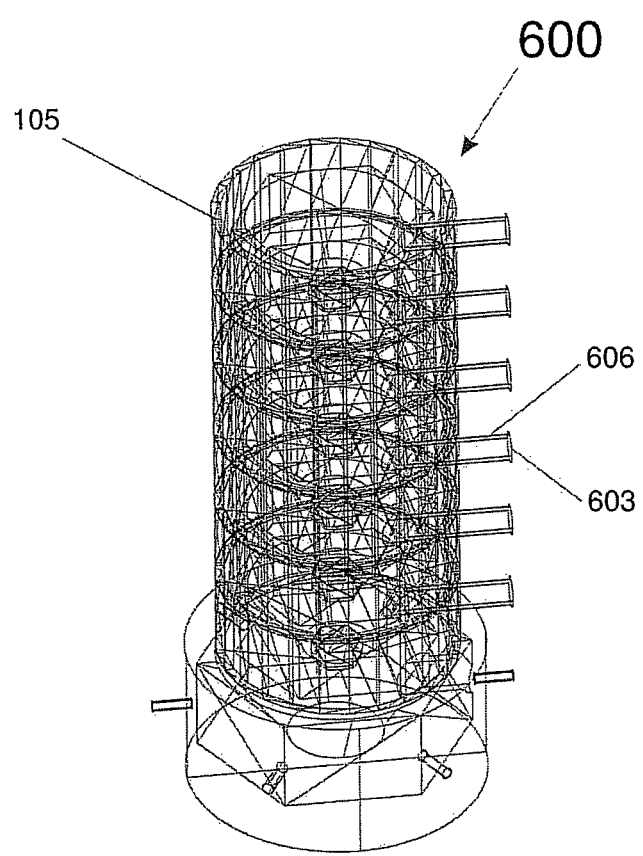
FIG. 6 shows a see-through version of a collection shaft with water/light conduction tubes leading off of it.
Figure 6A:
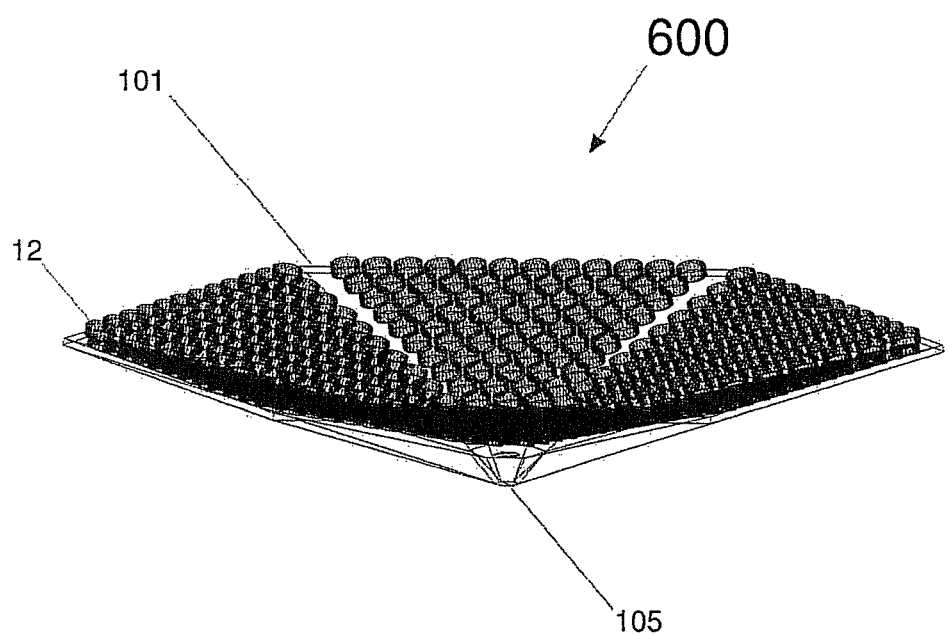
FIG. 6a shows an assembly of collector modules which may be used in conjunction with the shaft in exemplary FIG. 6.
Figure 6B:
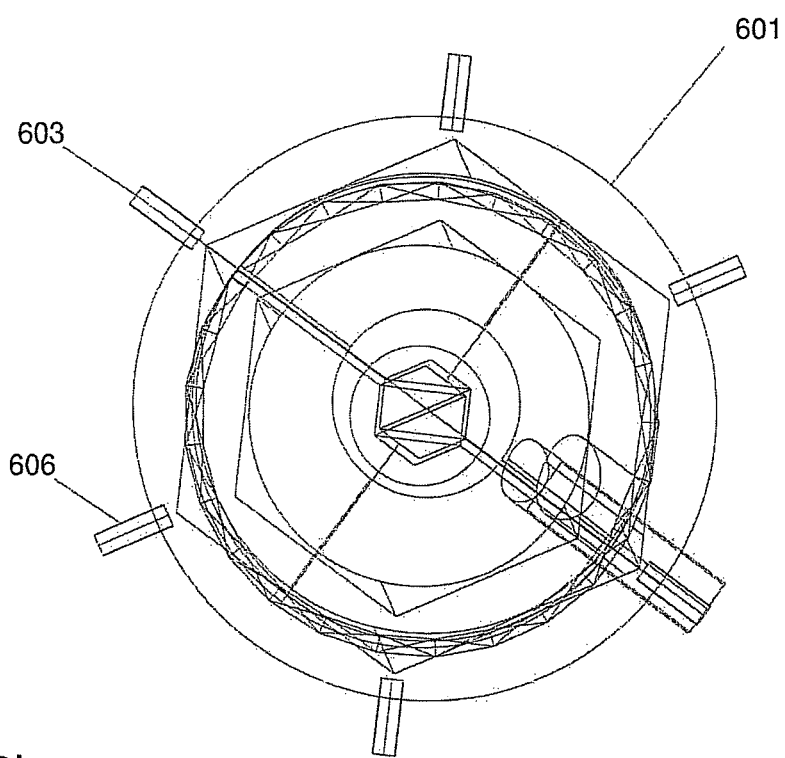
FIG. 6b shows a top-down view of the collection shaft of exemplary FIG. 6.

Exemplary FIGS. 6, 6a, and 6b show a distribution system 600 for water and light which can incorporate solar-energy collection assembly 101 utilizing thermal containers 12. Collection shaft 105 may be coupled proximate to the bottom of a concave assembly 101, which itself may be affixed to the roof of a building, to collect water and light and distribute it to different parts of the building. One or more conducting tubes 606 may lead from shaft 105 to different parts of the building, for example to each floor or to each room, where there may be openings 603 through which water and/or sunlight may pass. Light may be reflected or conducted through tubes 606 using mirrors or a fiber optic system, or as desired. Water may flow through tubes 606 using gravity or pumps, or as desired. Shaft 105 may additionally have an outer shell 601, which may have an aesthetically pleasing cylindrical shape.

Figure 6C:
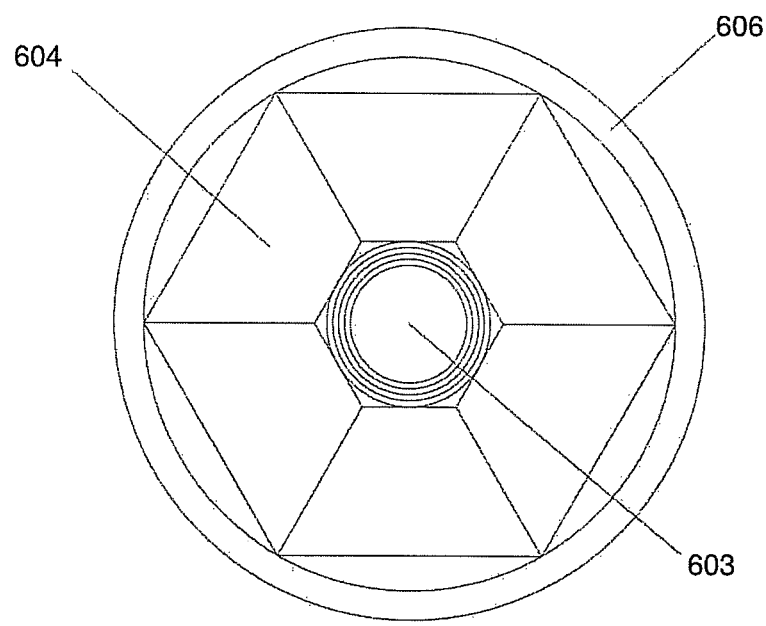
FIG. 6c shows a view of an opening of one of the conduction tubes of exemplary FIG. 6.

Exemplary FIG. 6c shows a cross-sectional view of a tube 606, as described above, with an opening 603. Mirrors 604 may be placed around opening 603, which may scatter or spread the entering light, thereby causing it to more efficiently brighten the interior area.

The advantages of this embodiment may be realized when installed by itself or as integrated with a building. For example, when integrated with a residential building, either single-family or a multi-family apartment building, the energy consumption of each affected household may be decreased. Additionally, the calming effects of a light place or a water place may be integrated with this embodiment as further described below.

Figure 7:
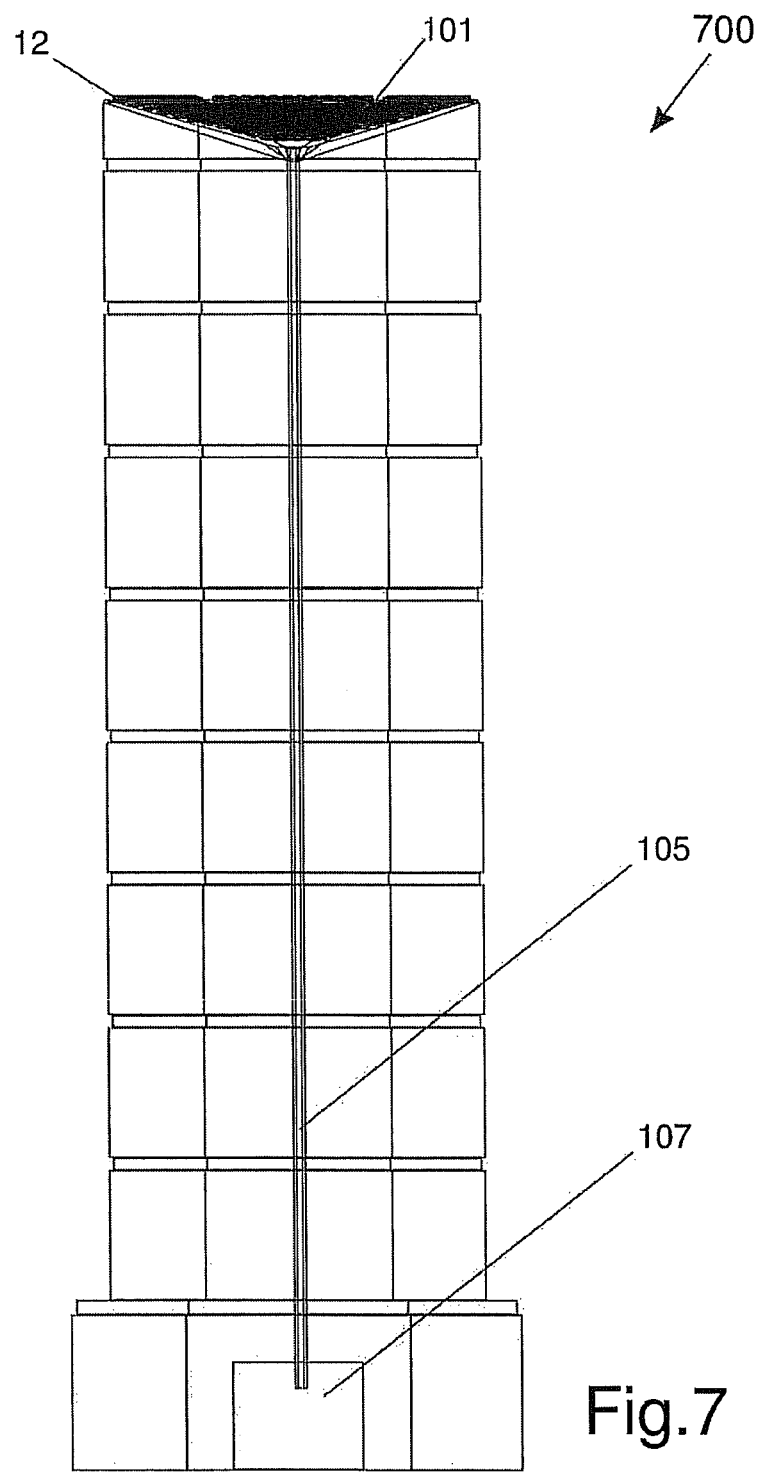
FIG. 7 shows a side-view of a vertical farming high rise building.

Exemplary FIG. 7 shows a non-limiting exemplary embodiment of a vertical farming high rise building 700 which may incorporate a solar-energy collection assembly 101 utilizing thermal containers 12. Collection shaft 105 may conduct collected rain water down through building 700 to a storage container 107. In the event water is needed in a part of building 700, water may be diverted in a manner similar to as described above and shown in exemplary FIG. 6, or water may be pumped up from container 107, as desired.

Figure 7A:
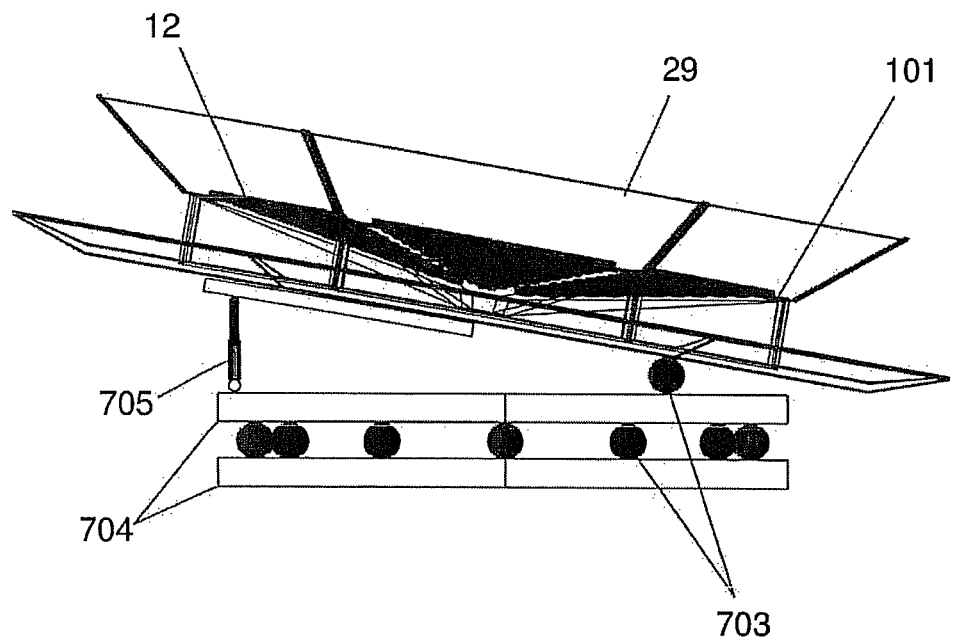
FIG. 7a shows a tracking system for use with an assembly of collector modules.

Now referring to exemplary FIG. 7a, a tracking system may be utilized with any of the above-described embodiments incorporating solar-energy collection assembly 101 utilizing thermal containers 12. At least one mirror 29 may be coupled to collection assembly 101 to concentrate the solar light. A pair of base structures 704 may support collection assembly 101 over a bearing system 703. Bearing system 703 may allow collection assembly 101 to rotate. A piston 705 may be coupled to collection assembly 101 and one of base structures 704, which may allow collection assembly 101 to tilt to various angles. Bearing system 703 and piston 705 may allow collection assembly 101 to be mounted on roofs with different pitches, or on the exterior wall of a structure, and continually track the sun as its position changes over the course of the year or a single day.

Figure 8:
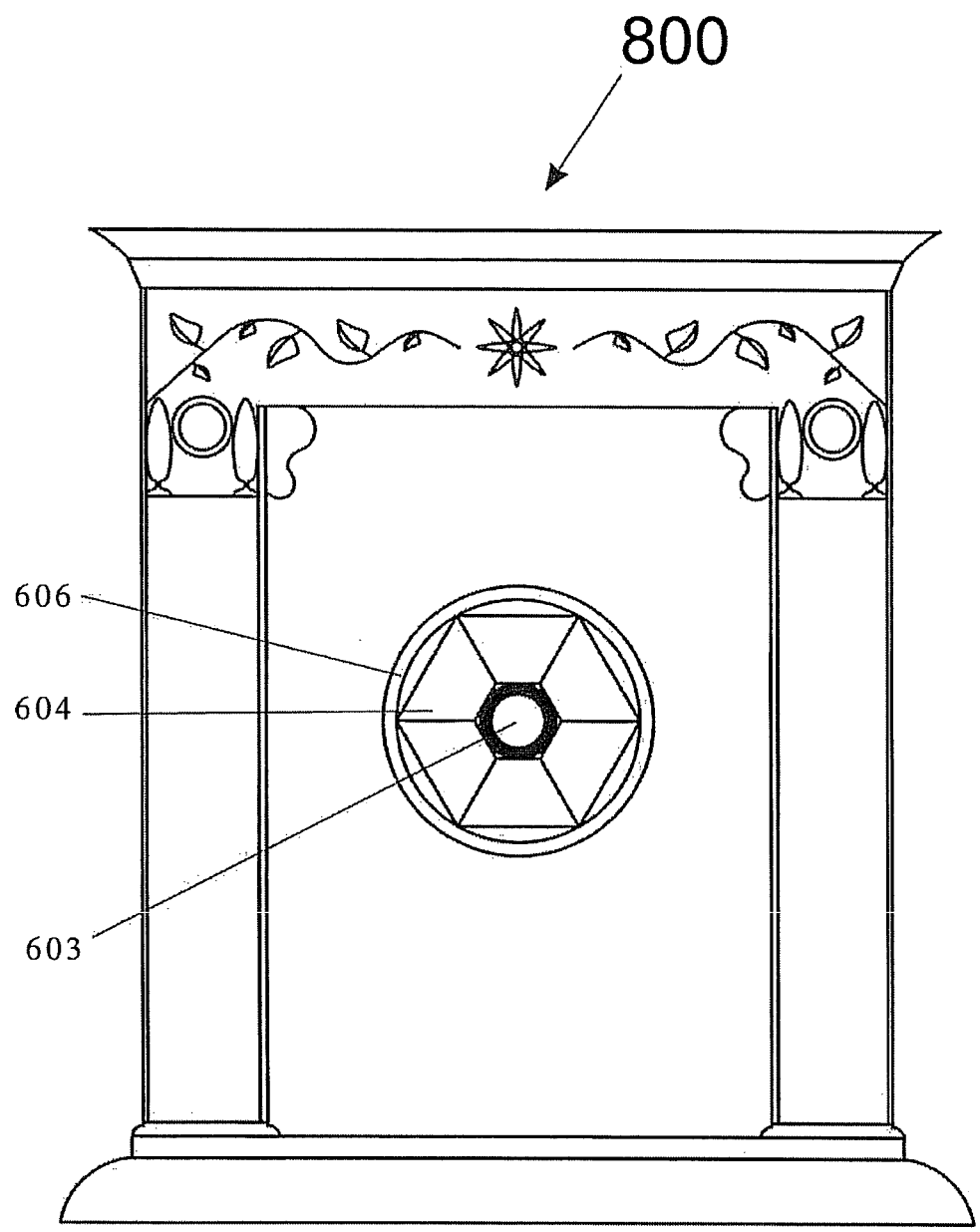
FIG. 8 shows a stylized "light place."

Exemplary FIG. 8 shows a stylized representation of a light place 800, incorporating a conducting tube 606, opening 603, and mirrors 604, as shown in exemplary FIG. 6c and described above. Light place 800 may be a decorative output for light conducted by conducting tube 606, and may be designed to be aesthetically pleasing, for example in the shape of a fireplace, and may provide light to an interior room of a building.

Figure 9:
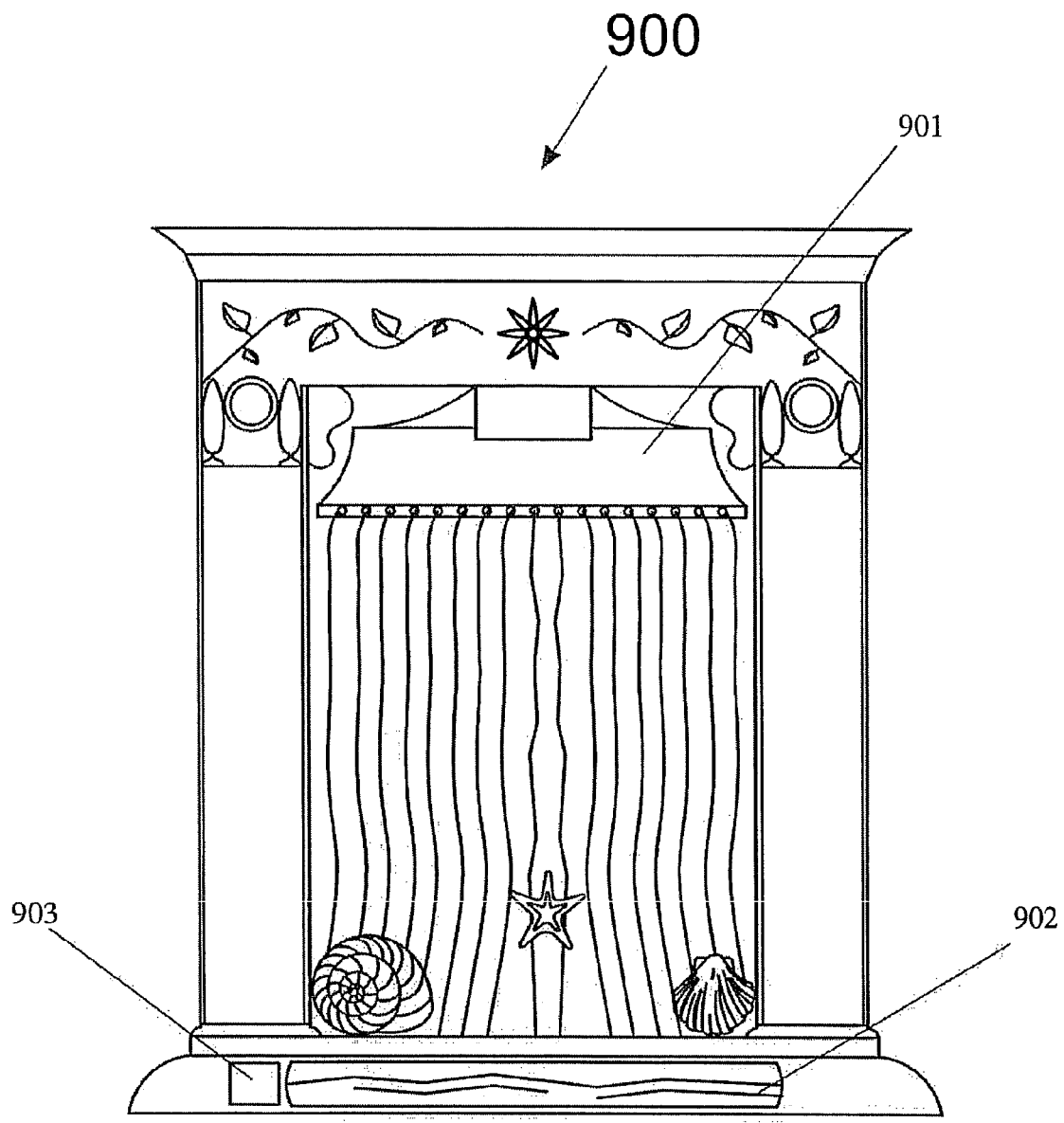
FIG. 9 shows a stylized "water place."

Exemplary FIG. 9 shows a stylized representation of a water place 900. Water place 900 may be a decorative output for water conducted by conducting tube 606 and may be designed to be aesthetically pleasing, for example in the shape of a fireplace, and may provide a calming waterfall to an interior room of a building. The water for water place 900 may be provided via a conducting tube 606 as shown in exemplary FIG. 6 and described above. Water place 900 may include a fountain 901, a reservoir 902, and a pump 903. The power for pump 903 may be supplied by an in-building generator, for example a generator for which the power is supplied by a solar-energy collection assembly 101 and any of the above-described embodiments. The evaporation inherent in an open-water system such as water place 900 may also cool the room in which it is located, thereby reducing the need for other air-conditioning energy costs.

Figure 10:
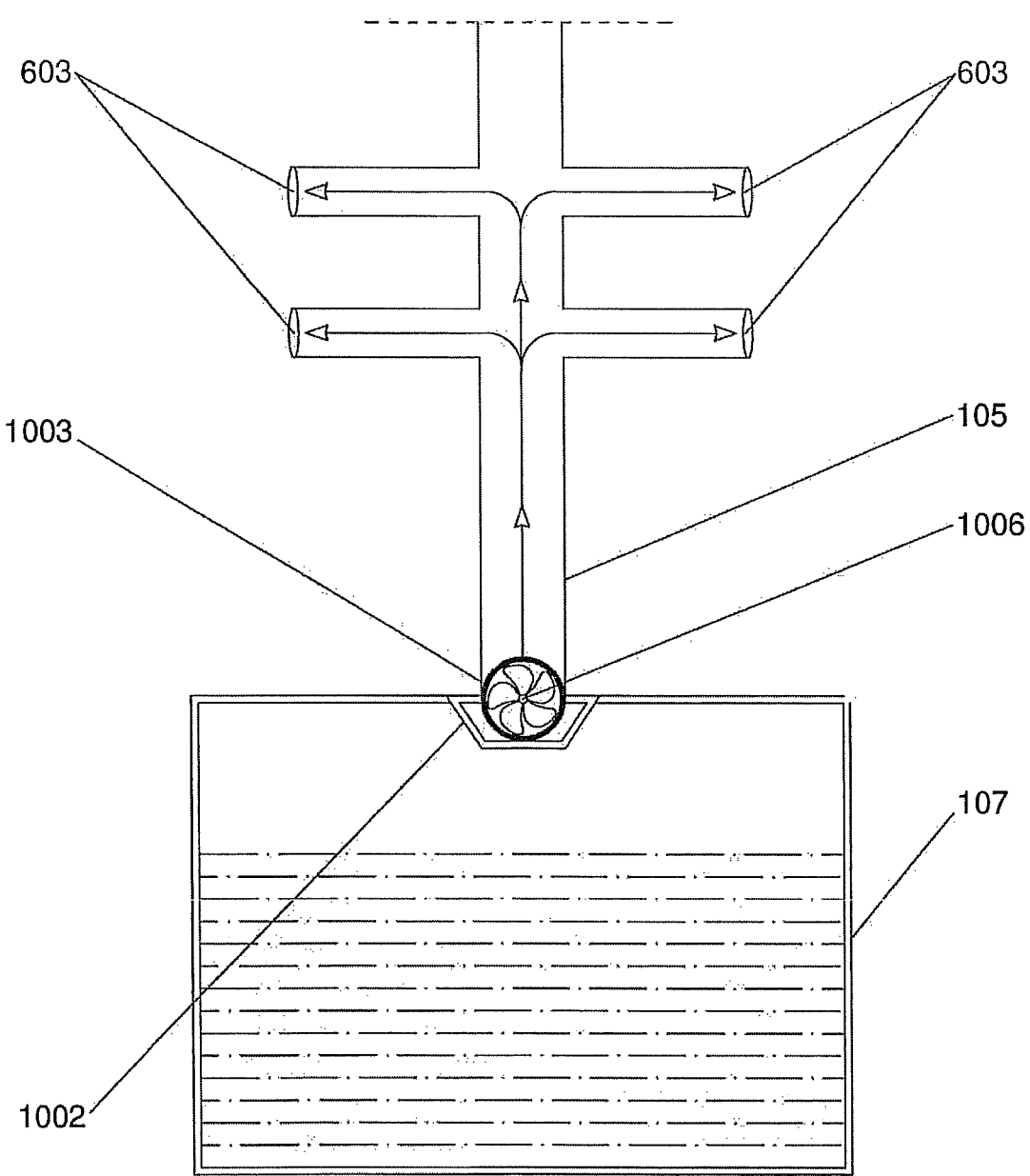
FIG. 10 shows a cooling and ventilation system incorporated into the water storage tank and collection shaft of an embodiment similar to that as shown in exemplary FIG. 2.

Exemplary FIG. 10 shows a cooling system using water collected in a storage container 107, for example as shown FIG. 2 and described above. A ventilator fan 1006 may move cool air from the top of container 107 through a filter 1002. The air may then be propelled by fan 1006 through shaft 105 and exit openings 603 into the interior of a building. The propelled air may thus cool the rooms into which it enters. A sensor 1003 may be installed at the fan 1006 to control the functioning of fan 1006, causing it to run or stop as desired. Fan 1006 may be powered by an in-building generator, for example a generator for which the power is supplied by a solar-energy collection assembly 101 and any of the above-described embodiments.

Figure 11:
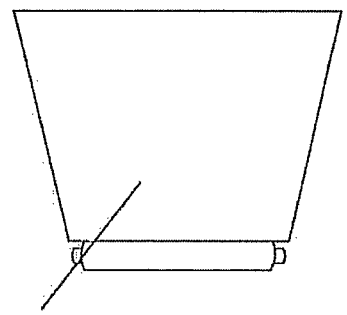
FIG. 11 shows several possible designs for light-reflecting mirrors for use with an assembly of collector modules.
Figure 11:
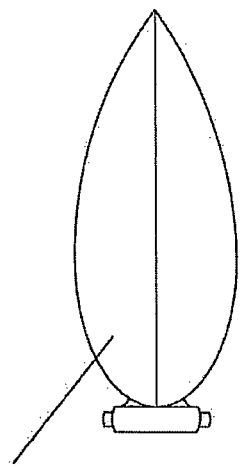
Figure 11:
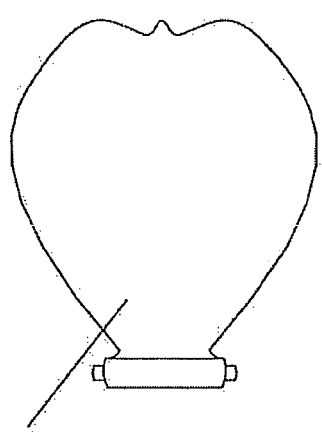
Figure 11:
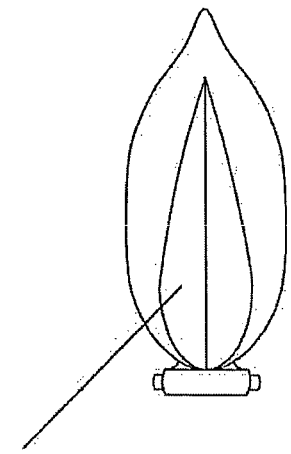

Exemplary FIG. 11 illustrates several non-limiting exemplary embodiments of a solar mirror 29 as described above. As shown in exemplary FIG. 11, the mirror may be a plate (29), a lotus flower design (29a), a rose petal design (29b), a sub flower petal design (29c), or as desired. Other designs for a mirror are also envisioned. Such flower-related designs may improve the aesthetic qualities of the solar-energy collecting assembly to which the mirror may be coupled.

Referring now generally to exemplary FIGS. 1-11, a variety of different configurations and usages are envisioned. A plurality of collector modules may be combined in a solar energy collecting assembly. The solar energy collecting assembly may further include one or more reflecting mirrors and/or a tracking system, and the assembly may be used individually or set up as a field of energy collectors. The heated thermal fluid from the collector modules may be used to heat an interior area and/or produce electricity. Also, a concave-shaped assembly may be used to collect water for other applications. Additionally, an open-structured water collection shaft may also be used to conduct light into the interior of a building.

The foregoing description and accompanying figures illustrate the principles, preferred embodiments and modes of operation of the invention. However, the invention should not be construed as being limited to the particular embodiments discussed above. Additional variations of the embodiments discussed above will be appreciated by those skilled in the art.

Therefore, the above-described embodiments should be regarded as illustrative rather than restrictive. Accordingly, it should be appreciated that variations to those embodiments can be made by those skilled in the art without departing from the scope of the invention as defined by the following claims.

What is claimed is:

1. A solar energy and water collection assembly comprising:
   a plurality of solar energy collector modules, each of said solar collector modules comprising at least one concentrating lens, a solar photovoltaic cell, and a thermally-conductive container containing a thermally conductive fluid, wherein the plurality of solar energy collector modules are directly contacting an inner concave surface of a pyramidal substrate;
   a collection shaft fluidly communicatively coupled to said inner concave surface; and
   a collection tank fluidly communicatively coupled to said collection shaft.

2. The solar energy and water collection assembly of claim 1, further comprising:
   at least two pipes fluidly connected to the thermally-conductive containers of the plurality of solar energy collector modules, at least one of the at least two pipes is an inlet for the thermally conductive fluid and at least one of the at least two pipes is an outlet for the thermally conductive fluid;
   a storage tank for said thermally conductive fluid; and
   a plurality of connecting pipes between said at least two pipes fluidly connected to the thermally-conductive containers of the plurality of solar energy collector modules;
   wherein said connecting pipes are configured to allow said thermally conductive fluid to flow through the interior of a building such that the thermally conductive fluid is capable of substantially heating the interior of the building.

3. The solar energy and water collection assembly of claim 1, further comprising:
   at least two pipes fluidly connected to the thermally-conductive containers of the plurality of solar energy collector modules, at least one of the at least two pipes is an inlet for the thermally conductive fluid and at least one of the at least two pipes is an outlet for the thermally conductive fluid;
   a heat exchanger, said heat exchanger functionally coupled to a steam-turbine generator; and
   a storage container for the thermally conductive fluid, said storage container configured to accept the thermally conductive fluid flowing from the thermally-conductive containers of the plurality of solar energy collector modules and discharge thermally conductive fluid to flow back to the thermally-conductive containers of the plurality of solar energy collector modules;
   wherein the heat exchanger is configured to draw heat from the thermally conductive fluid to operate the steam-turbine generator.

4. The solar energy and water collection assembly of claim 1, further comprising at least one reflective mirror configured to reflect sunlight onto said solar energy collector modules.

5. The solar energy and water collection assembly of claim 1, further comprising:
   a filter located proximate to the bottom of the collection shaft, said filter configured to impede the flow of particulate matter while allowing water to pass through; and
   an opening in the collection shaft, said opening located proximate to the filter such that particulate matter impeded by said filter may pass through said opening and thereby out of said collection shaft.

6. The solar energy and water collection assembly of claim 1, wherein said solar and water collection assembly is integrated with a building, further comprising:
   a plurality of conducting tubes fluidly communicative with the collection shaft;
   an opening at the terminus of each conducting tube; and
   an fiber optics system, said fiber optics system configured to conduct light through the collection shaft and the conducting tubes to the openings;
   wherein the conducting tubes are configured to allow water to flow along said conducting tubes from the collection shaft to the openings.

7. The solar energy and water collection assembly of claim 6 wherein the building is one of a single-family dwelling and a multi-family apartment building.

8. The solar energy and water collection assembly of claim 6 further comprising mirrors located proximate to the openings of each conducting tube, said mirrors configured to spread the light conducted by the fiber optics system.

9. The solar energy and water collection assembly of claim 6, further comprising a ventilation system, the ventilation system comprising:
   a ventilator fan located proximate to a bottom of the collection shaft;
   an air filter located proximate to a top of the collection tank; and
   a control sensor functionally coupled to said ventilator fan;
   wherein the ventilator fan is configured to propel air from the top of the collection tank into the collection shaft, through the conducting tubes, and out of the openings.

10. The solar energy and water collection assembly of claim 1, further comprising a tracking system, the tracking system comprising:
    at least two base structures;
    a bearing system; and
    an elevating piston;
    wherein the tracking system is configured to rotate and tilt the inner concave surface such that the solar energy collector modules may have access to sunlight.

11. A system for reducing the external energy requirements of a building, comprising:
    a solar-energy collection assembly, the assembly comprising:
    a plurality of solar energy collector modules, each of said solar collector modules comprising at least one concentrating lens, a solar photovoltaic cell, and a thermally-conductive container containing a thermally conductive fluid, wherein the plurality of solar energy collector modules are directly contacting an inner concave surface of pyramidal substrate;
    a heat exchanger fluidly communicatively coupled to the thermally-conductive containers of the solar-energy collection assembly;
    a steam-turbine generator functionally coupled to the heat exchanger;
    a collection shaft fluidly communicatively coupled proximate to the bottom of the inner concave surface of said solar-energy collection assembly; and
    a collection tank fluidly communicatively coupled to said collection shaft;
    wherein the solar-energy collection assembly is configured to absorb heat energy from sunlight into the thermally conductive fluid,
    wherein the absorbed heat in the thermally conductive fluid may be transferred by the heat exchanger to a second fluid, and
    wherein the second fluid may drive the steam-turbine generator.

12. The system for reducing the external energy requirements of a building of claim 11, further comprising:

a plurality of conducting tubes fluidly communicative with the collection shaft;

an opening at the terminus of each conducting tube; and an fiber optics system, said fiber optics system configured to conduct light through the collection shaft and the conducting tubes to the openings;

wherein the conducting tubes are configured to allow water to flow along said conducting tubes from the collection shaft to the openings.

13. The system for reducing the external energy requirements of a building of claim 12, further comprising at least one light location, wherein the at least one light location is a decorative output for light conducted by the fiber optics system.

14. The system for reducing the external energy requirements of a building of claim 12, further comprising at least one water location, wherein the at least one water location place is a decorative output for water conducted by the conducting tubes.

15. The system for reducing the external energy requirements of a building of claim 11, further comprising a ventilation system, the ventilation system comprising:

a ventilator fan located proximate to a bottom of the collection shaft;

an air filter located proximate to a top of the collection tank; and a control sensor functionally coupled to said ventilator fan;

wherein the ventilator fan is configured to propel air from the top of the collection tank into the collection shaft, through the conducting tubes, and out of the openings.

16. The system for reducing the external energy requirements of a building of claim 11, further comprising a tracking system, the tracking system comprising:

at least two base structures;

a bearing system; and an elevating piston;

wherein the tracking system is configured to rotate and tilt the solar-energy collection assembly such that the solar energy collector modules may have access to sunlight.

* * * * *